US010969891B2

(12) United States Patent
He et al.

(10) Patent No.: US 10,969,891 B2
(45) Date of Patent: Apr. 6, 2021

(54) DISPLAY PANEL AND DISPLAY DEVICE (71) Applicant: Wuhan Tianma Micro-Electronics Co., Ltd., Wuhan (CN)

(72) Inventors: Pei He, Wuhan (CN); Tao Peng, Wuhan (CN); Shanfu Yuan, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/665,816

(22) Filed: Oct. 28, 2019

(65) Prior Publication Data

US 2020/0310575 A1 Oct. 1, 2020

(30) Foreign Application Priority Data

Mar. 29, 2019 (CN) .......................... 201910255141.0

(51) Int. Cl.
*G06F 3/041* (2006.01)
*G06F 3/044* (2006.01)
*H01L 27/32* (2006.01)
*H01L 51/52* (2006.01)

(52) U.S. Cl.
CPC .......... *G06F 3/0412* (2013.01); *G06F 3/0446* (2019.05); *H01L 27/3276* (2013.01); *H01L 51/5253* (2013.01)

(58) Field of Classification Search
CPC . G06F 3/0412; G06F 3/0446; H01L 27/3276; H01L 51/5253
See application file for complete search history.

(56) References Cited

U.S. PATENT DOCUMENTS

| | | | |
|---|---|---|---|
| 6,787,388 B1 * | 9/2004 | Chiu .................. | G06K 9/00053 257/E23.048 |
| 2004/0239248 A1 * | 12/2004 | Chang ..................... | C03C 17/36 313/582 |
| 2011/0018560 A1 * | 1/2011 | Kurashima .......... | H05K 1/0216 324/679 |
| 2017/0250228 A1 * | 8/2017 | Liao .................... | H01L 27/3276 |

(Continued)

FOREIGN PATENT DOCUMENTS

CN 109671703 A 4/2019

*Primary Examiner* — Ariel A Balaoing
(74) *Attorney, Agent, or Firm* — Miller Matthias & Hull LLP (57) ABSTRACT

Disclosed are a display panel and a display device. The display panel includes a display region; a non-display region around the display region; a touch layer including first touch electrodes and second touch electrodes, the first touch electrodes extend along a first direction and are arranged along a second direction, the second touch electrodes extend along the second direction and are arranged along the first direction, the first direction intersects with the second direction; a touch chip, each first touch electrode is connected to the touch chip through a first touch lead, each second touch electrode is connected to the touch chip through a second touch lead; an electrostatic protective layer disposed around the display region; an encapsulation element disposed around the display region. In a direction perpendicular to the display panel, the electrostatic protective layer covers at least the first touch lead and covers the encapsulation element.

17 Claims, 8 Drawing Sheets

(56) References Cited

U.S. PATENT DOCUMENTS

| | | | |
|---|---|---|---|
| 2018/0088631 A1* | 3/2018 | Park | G06F 1/1643 |
| 2018/0129330 A1* | 5/2018 | Ding | G06F 3/0412 |
| 2018/0321779 A1* | 11/2018 | Huang | G06F 3/044 |
| 2019/0369787 A1* | 12/2019 | Park | G06F 3/044 |

* cited by examiner

DISPLAY PANEL AND DISPLAY DEVICE

CROSS-REFERENCES TO RELATED APPLICATIONS

This application claims priority to Chinese patent application No. 201910255141.0 filed on Mar. 29, 2019, the disclosure of which is incorporated herein by reference in its entirety.

TECHNICAL FIELD

The present disclosure relates to the field of display technologies and, in particular, to a display panel and a display device including the display panel.

BACKGROUND

With the continuous development of display technologies, consumers' requirements for display panels are continuously improving, and various display panels have emerged and been developed rapidly, such as liquid crystal display panels, organic light-emitting display panels, etc. On this basis, display technologies, such as 3D display, a touch display technology, curved display, ultra-high resolution display and peep-proof display, are constantly emerging to meet the demands of consumers.

The touch function is one of the necessary functions for the current display screen. The touch function is implemented in various forms and structures, such as self-capacitance and mutual-capacitance touch modes, and in-cell, on-cell or out-cell touch structures. Generally, the touch function is implemented by connecting a touch electrode to a touch chip through a touch lead, and the touch lead is easily interfered with by static electricity, resulting in a failure of the touch function of the display panel. In addition, the display panel generally includes an encapsulation element for sealing the display panel, and the encapsulation element is generally located at an edge of the display panel and is easily damaged by external static electricity, thereby affecting the sealing performance of the display panel. Therefore, the electrostatic protection problem is a key factor in ensuring the normal display function of the display panel, and this problem becomes one of the urgent problems to be solved in the display field.

SUMMARY

In view of the above, the present disclosure provides a display panel, to solve an electrostatic protection problem of a display panel edge, in particular of a touch display panel edge, and to ensure a normal display function of the display panel.

An aspect of embodiments of the present disclosure provides a display panel. The display panel includes:
- a display region and a non-display region around the display region;
- a touch layer including first touch electrodes and second touch electrodes, where the first touch electrodes extend along a first direction and are arranged along a second direction, the second touch electrodes extend along the second direction and are arranged along the first direction, and the first direction intersects with the second direction;
- a touch chip, where each of the first touch electrodes is connected to the touch chip through a first touch lead, and each of the second touch electrodes is connected to the touch chip through a second touch lead;
- an electrostatic protective layer disposed around the display region; and
- an encapsulation element disposed around the display region.

In a direction perpendicular to a surface of the display panel, the electrostatic protective layer covers at least the first touch lead and covers the encapsulation element.

Another aspect of the embodiments of the present disclosure provides a display device including the display panel described above.

As can be seen from the above description, for the display panel and the display device provided in the embodiments of the present disclosure, the display panel includes the first touch electrodes, the second touch electrodes, the first touch leads and the second touch leads. The electrostatic protective layer covers the first touch leads and covers the encapsulation element in the direction perpendicular to the surface of the display panel, thereby simultaneously protecting the first touch leads and the encapsulation element from electrostatic interference through the electrostatic protective layer. The structure is simple, the implementation is easy, and the normal operation of the touch layer and the encapsulation element is ensured, thereby ensuring the normal display function of the display panel.

DETAILED DESCRIPTION

To obtain a clearer understanding of objects, features and advantages of the present disclosure, the present disclosure will be further described below in conjunction with the drawings and embodiments.

It is to be noted that details are set forth below to facilitate a thorough understanding of the present disclosure. However, the present disclosure may be implemented by various embodiments different from the embodiments described herein, and those skilled in the art may make similar generalizations without departing from the spirit of the present disclosure. Therefore, the present disclosure is not limited to the specific embodiments disclosed below.

Figure 1:
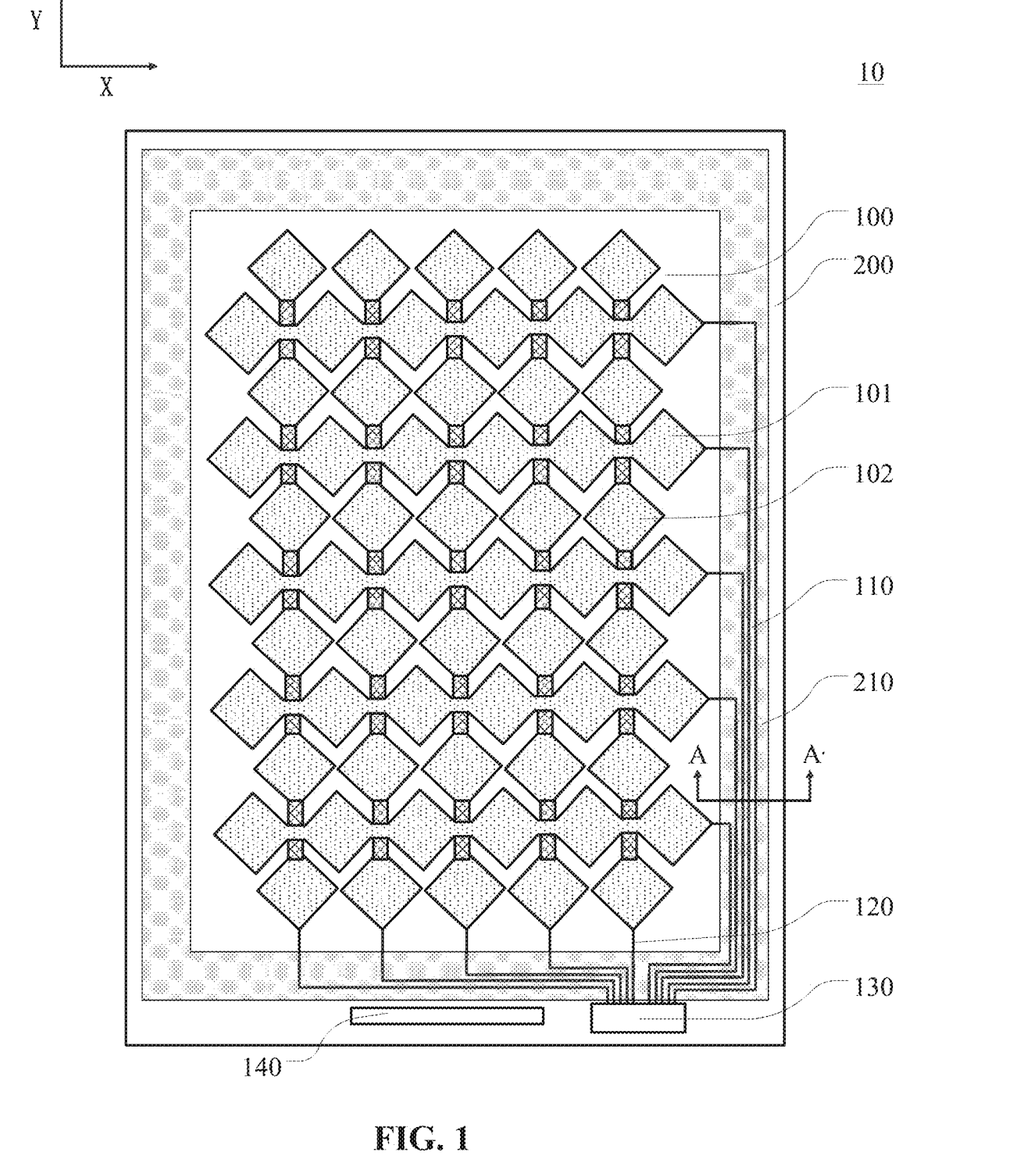
FIG. 1 is a structural diagram illustrating a display panel according to an embodiment of the present disclosure.
Figure 2:
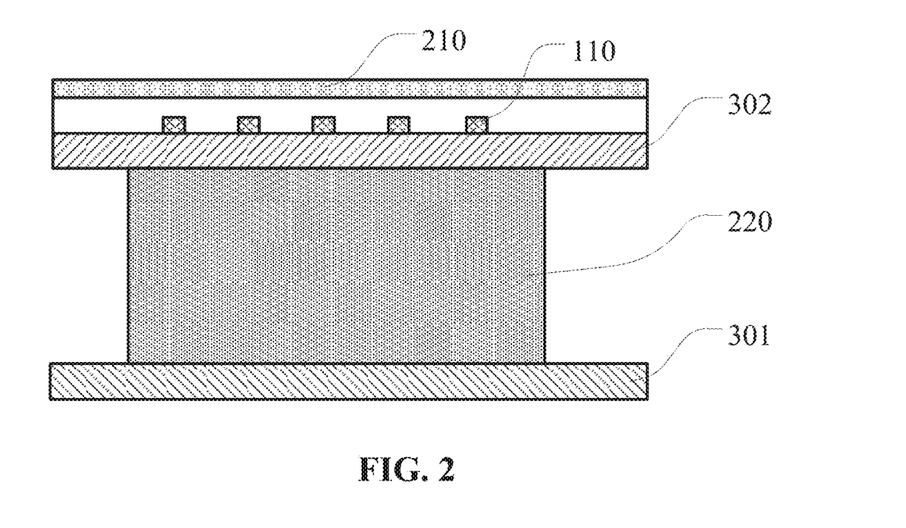
FIG. 2 is a sectional view taken along a line A-A of FIG. 1.

Referring to FIG. 1 and FIG. 2, FIG. 1 is a structural diagram illustrating a display panel according to an embodiment of the present disclosure, and FIG. 2 is a sectional view taken along a line A-A of FIG. 1. A display panel 10 includes a display region 100 and a non-display region 200 around the display region 100; a touch layer, including first touch electrodes 101 and second touch electrodes 102, where each of the first touch electrodes 101 extends along a first direction X and the first touch electrodes are arranged along a second direction Y, each of the second touch electrodes 102 extends along the second direction Y and the second touch electrodes are arranged along the first direction X, and the first direction intersects with the second direction, in particular, the first direction and the second direction are orthogonal with each other in FIG. 1; a touch chip 130, where each of the first touch electrodes 101 is connected to the touch chip 130 through a first touch lead 110, and each of the second touch electrodes 102 is connected to the touch chip 130 through a second touch lead 120; an electrostatic protective layer 210 disposed around the display region 100; and an encapsulation element 220 disposed around the display region 100. In a direction perpendicular to a surface of the display panel 10, the electrostatic protective layer 210 covers at least the first touch leads and covers the encapsulation element 220.

It should be noted that the display panel 10 provided in the embodiment may be an organic light-emitting display panel. The organic light-emitting display panel includes an anode and a cathode, and an organic light-emitting layer located between the anode and the cathode. A voltage is applied between the anode and the cathode to activate carriers to move and act on the organic light-emitting layer to emit light. In other embodiments of the present disclosure, the display panel 10 may further be other display panels, such as a quantum-dot light-emitting display panel, a nano wafer light-emitting display panel and the like, which will not be repeated in the embodiment.

In addition, it should be noted that, as shown in FIG. 1, the display panel 10 includes the touch chip 130 connected to the first touch electrodes 101 and the second touch electrodes 102. The first touch electrodes 101 may be touch detection electrodes for receiving a touch detection signal, and the second touch electrodes 102 may be touch drive electrodes for providing a touch drive signal. The display panel 10 may further include a display drive chip 140 for providing a display signal for the display panel. In other embodiments of the present disclosure, the touch chip 130 and the display drive chip 140 may also be integrated into the same chip, thereby further saving the frame area of the display panel. In addition, as shown in FIG. 2, the display panel 10 may include a base substrate 301 and an encapsulation cover plate 302. The encapsulation element 220 is located between the base substrate 301 and the encapsulation cover plate 302 for encapsulating the display panel 10.

As can be seen from the above description, for the display panel provided in the embodiment, the display panel 10 includes the first touch electrodes 101, the second touch electrodes 102, the first touch leads 110 and the second touch leads 102. The electrostatic protective layer 210 covers at least the first touch leads 110 and the encapsulation element 220 in the direction perpendicular to the surface of the display panel 10, thereby simultaneously protecting the first touch leads 110 and the encapsulation element 220 from electrostatic interference through the electrostatic protective layer 210. The structure is simple, the implementation is easy, and the normal operation of the touch layer and the encapsulation element is ensured, thereby ensuring the normal display function of the display panel.

Optionally, in the embodiment, in order to sufficiently protect the encapsulation element 220 from electrostatic interference, as shown in FIG. 2, the electrostatic protective layer 210 fully covers the encapsulation element 220 in the direction perpendicular to the surface of the display panel 10. Thus, the electrostatic protection effect can be sufficiently achieved.

Figure 3:
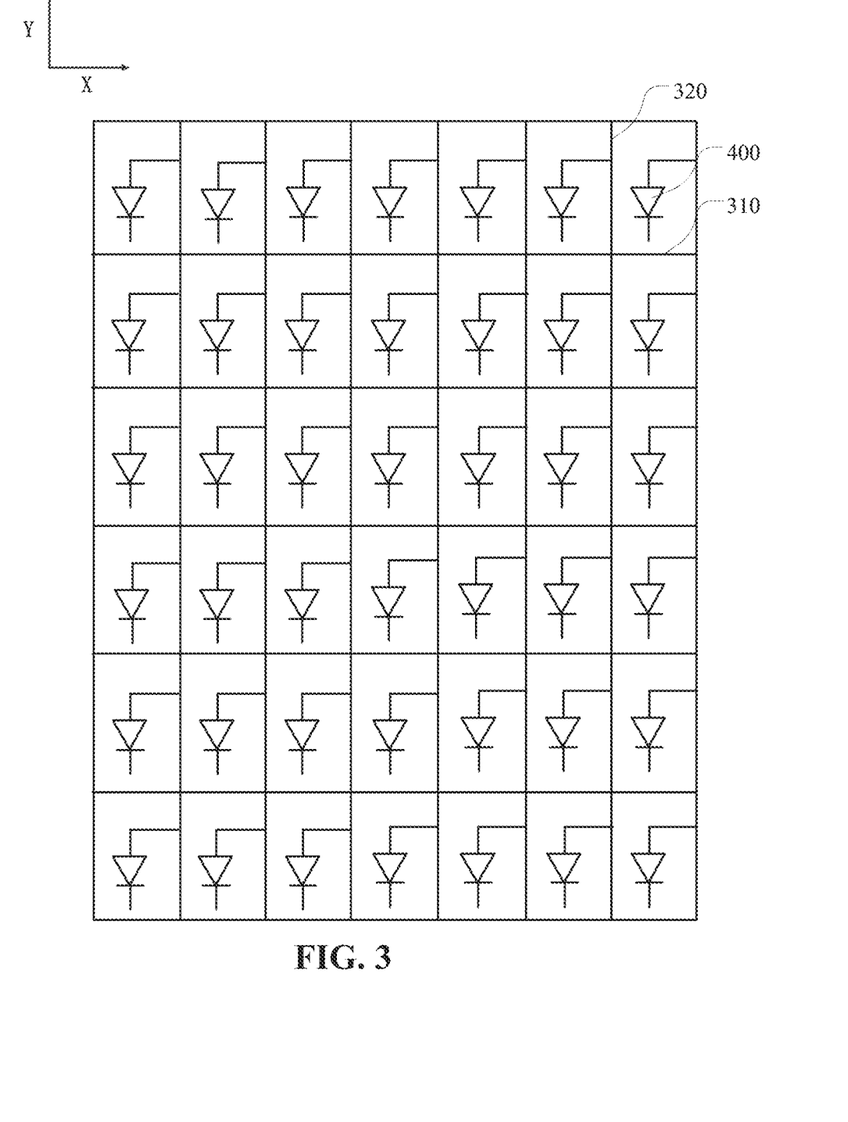
FIG. 3 is a schematic diagram illustrating another display panel according to an embodiment of the present disclosure.

Referring to FIG. 3, FIG. 3 is a schematic diagram illustrating another display panel according to an embodiment of the present disclosure. The display panel 10 includes gate signal lines 310 for providing a gate scan signal and data signal lines 320 for providing a display data signal to display units 400 in the display region 100. Each gate signal line 310 extends along the first direction X, each data signal line extends along the second direction Y, and the touch chip 130 is located on a side of the display region 100 along the second direction Y. With such a design, it can be concluded that each gate signal line 310 is parallel to the first touch electrode 101, and each data signal line 320 is parallel to the second touch electrode 102. Since the touch chip 130 is located on the side of the display region 100 along the second direction Y, the second touch leads 120 may extend along the second direction to be directly connected to the touch chip 130, while the first touch leads 110 extend to the left or right frame of the display panel and then to the touch chip 130. Therefore, the first touch leads 110 have a longer length, and are more likely to be interfered with by static electricity because the first touch leads 110 extend to the left and right frames. Therefore, the electrostatic protective layer 210 should cover at least the first touch leads 110, thereby preventing the first touch leads 110 from being interfered with by static electricity.

Optionally, in the embodiment, as shown in FIG. 1, in the direction perpendicular to the surface of the display panel 10, the electrostatic protective layer 210 simultaneously covers the first touch leads 110 and the second touch leads 120. With such a design, the electrostatic protective layer 210 can play a role of preventing both the first touch leads 110 and the second touch leads 120 from static electricity, thereby further ensuring the normal display function of the display panel.

Figure 4:
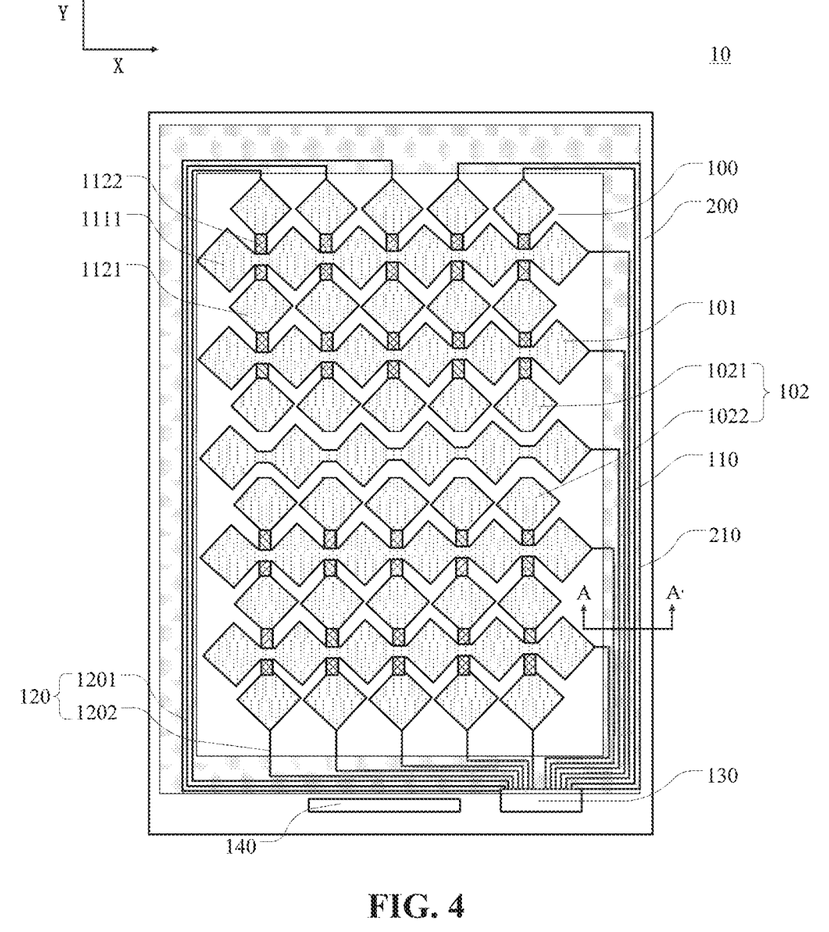
FIG. 4 is a structural diagram illustrating yet another display panel according to an embodiment of the present disclosure.

Referring to FIG. 4, FIG. 4 is a structural diagram illustrating another display panel according to an embodiment of the present disclosure. Each second touch electrode 102 includes a first sub-touch electrode 1021 and a second sub-touch electrode 1022. Along the second direction Y, the first sub-touch electrode 1021 is located on a side of the second sub-touch electrode 1022 facing away from the touch chip 130. Each second touch lead 120 includes a first sub-touch lead 1201 and a second sub-touch lead 1202. The first sub-touch electrode 1021 is connected to the touch chip 130 through the first sub-touch lead 1201, and the second sub-touch electrode 1022 is connected to the touch chip 130 through the second sub-touch lead 1202. The electrostatic protective layer 210 covers at least the first sub-touch leads 1201. Since the first sub-touch electrodes 1201 are located on a side of the second sub-touch electrodes 1202 facing away from the touch chip 130, the first sub-touch leads 1201 need to be connected to the touch chip 130 after passing through the left or right frame. As a result, the first sub-touch leads 1201 are longer and occupy a larger area. Therefore, the electrostatic protective layer 210 covers at least the first sub-touch leads 1201, so that the first sub-touch leads 1201 can be prevented from being disturbed by static electricity. Optionally, in other embodiments of the present disclosure, the electrostatic protective layer 210 may also simultaneously cover both the first sub-touch leads 1201 and the second sub-touch leads 1202, thereby further improving the electrostatic protection capability of the display panel.

Further referring to FIG. 4, each of the first touch electrodes 101 includes a plurality of interconnected first touch units 1111, and each of the second touch electrodes 102 includes a plurality of interconnected second touch units 1121. The first touch units 1111 are located on the same layer as the second touch units 1121. Each of the second touch units 1121 is connected to each other through a bridge 1122, and the bridge 1122 is located on the same layer as the first touch lead 110 and the second touch lead 120. With such a design, the first touch units 1111 and the second touch units 1121 can be formed through the same process flow, and the bridge 1122, the first touch lead 110 and the second touch lead 120 can be formed through the same process flow. Therefore, the process can be simplified and the efficiency can be improved. In general, the first touch unit 1111 and the second touch unit 1121 may be a transparent conductive layer, such as indium tin oxide. The first touch lead 110, the second touch lead 120 and the bridge 1022 may be made of metal materials. Details are not described in the embodiment.

In addition, optionally, in the embodiment, the electrostatic protective layer 210 is located on the same layer as the first touch units 1111 and the second touch units 1121, and the electrostatic protective layer 210 may also be formed of the same material as the first touch units 1111 and the second touch units 1121. Thus, the process can be further simplified and the efficiency can be further improved.

Figure 5:
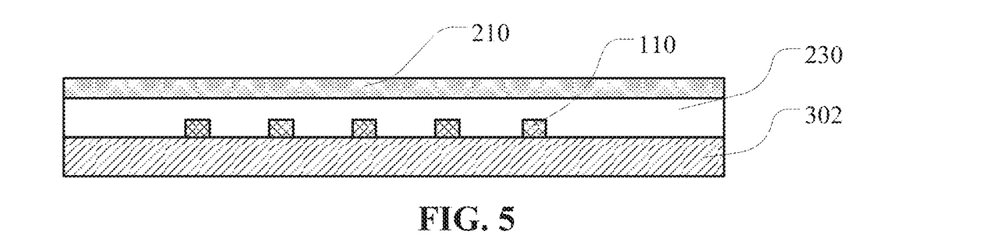
FIG. 5 is a structure diagram of a touch layer according to an embodiment of the present disclosure.

Optionally, in the embodiment, referring to FIG. 5, FIG. 5 is a structure diagram illustrating a touch layer according to an embodiment of the present disclosure. A first insulating layer 230 is arranged between the electrostatic protective layer 210 and the first touch leads 110, and a dielectric constant of the first insulating layer 230 is less than 4.2. As the electrostatic protective layer 210 and the first touch leads 110, which are both conductive materials, overlap, parasitic capacitance is generated, and the presence of the parasitic capacitance causes a load on the touch leads to affect the signal transmission. In order to ensure the normal transmission of the signal, the parasitic capacitance should be as small as possible. The capacitance is proportional to the dielectric constant of the capacitive medium, and therefore the dielectric constant of the first insulating layer is required to be sufficiently small to reduce the parasitic capacitance. The inventor of the present application has found that when the dielectric constant of the first insulating layer 230 is less than 4.2, the influence of the parasitic capacitance on the touch leads is substantially negligible, thereby ensuring the normal transmission of the touch signal. It should be noted that the dielectric constant here is a relative dielectric constant.

Figure 6:
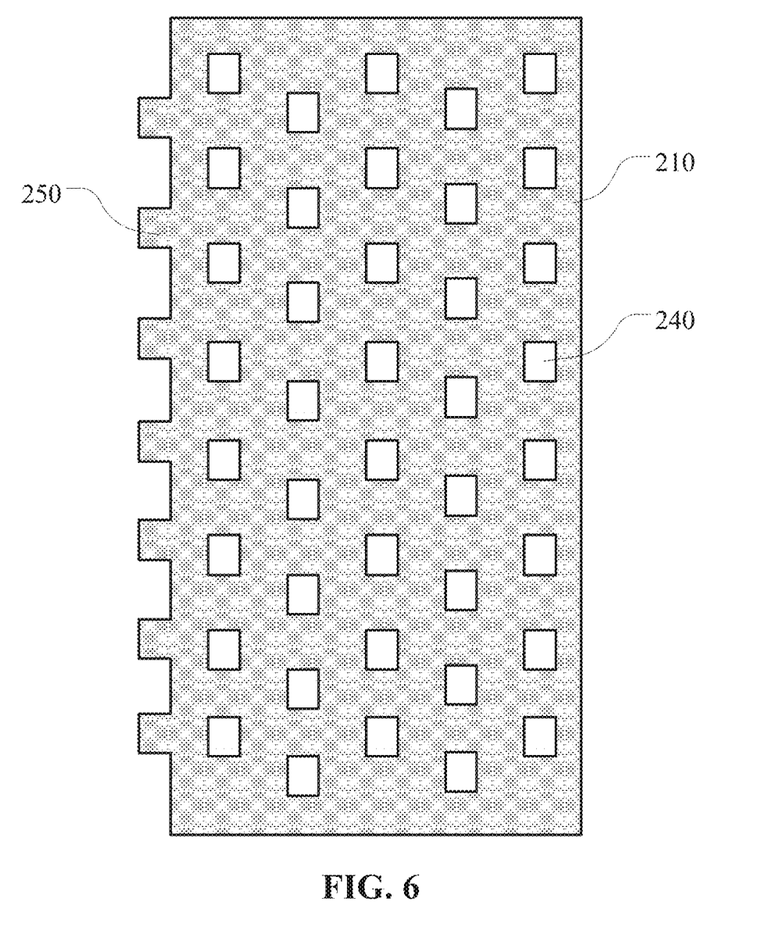
FIG. 6 is a structure diagram of an electrostatic protective layer according to an embodiment of the present disclosure.

In addition, optionally, referring to FIG. 6, FIG. 6 is a structure diagram illustrating an electrostatic protective layer according to an embodiment of the present disclosure. The electrostatic protective layer 210 is of a hollow structure and includes at least one opening 240. With such a design, the overlap area of the electrostatic protective layer 210 and the first touch leads 110 can be reduced, thereby reducing the parasitic capacitance between the electrostatic protective layer 210 and the first touch leads 110, and ensuring normal transmission of the touch signal.

Further, the electrostatic protective layer 210 is latticed, so that the material can be reduced and the cost can be saved while the parasitic capacitance between the electrostatic protective layer 210 and the first touch leads 110 is reduced.

Further, in the embodiment, in the direction perpendicular to the surface of the display panel 10, each opening 240 covers at least one first touch lead 110 and is directly above the first touch lead 110, so that the overlap area of the first touch lead 110 and the electrostatic protective layer 210 can be reduced, thereby reducing the parasitic capacitance and ensuring the normal transmission of the touch signal.

In addition, in the embodiment, as shown in FIG. 6, the electrostatic protective layer 210 further includes a plurality of projections 250 arranged on a side of the electrostatic protective layer 210 facing away from the display region 100. The main function of the electrostatic protective layer 210 is electrostatic protection, and a tip discharge, as an effective electrostatic protection measure, can better protect the other components from the electrostatic interference. Therefore, the projections 250 are disposed on the side of the electrostatic protective layer 210 facing away from the display region 100, and then the static electricity can be quickly released through the tip discharge, so that the touch leads are free from electrostatic interference.

In the embodiment, optionally, as shown in FIG. 2, the display panel 10 includes the base substrate 301 and the encapsulation cover plate 302. Both the touch layer and the electrostatic protective layer 210 are located on a side of the encapsulation cover plate 302 facing away from the base substrate 301. Thus, the touch mode provided in the embodiment is an external touch mode, i.e., the on-cell touch mode. The touch layer is located on the encapsulation cover plate 302.

Further, optionally, the display panel 10 may be a rigid display panel, the encapsulation element 220 may be a sealing layer disposed around the display region 100, and the material of the sealing layer may be a glass frit containing additives. During processing and transportation of the display panel, various kinds of static electricity are generated, and the glass frit is easily damaged due to electrostatic interference, thereby affecting the encapsulation effect of the display panel. Therefore, the electrostatic protective layer 21 covers the sealing layer to protect the sealing layer from damage due to static electricity.

Figure 7:
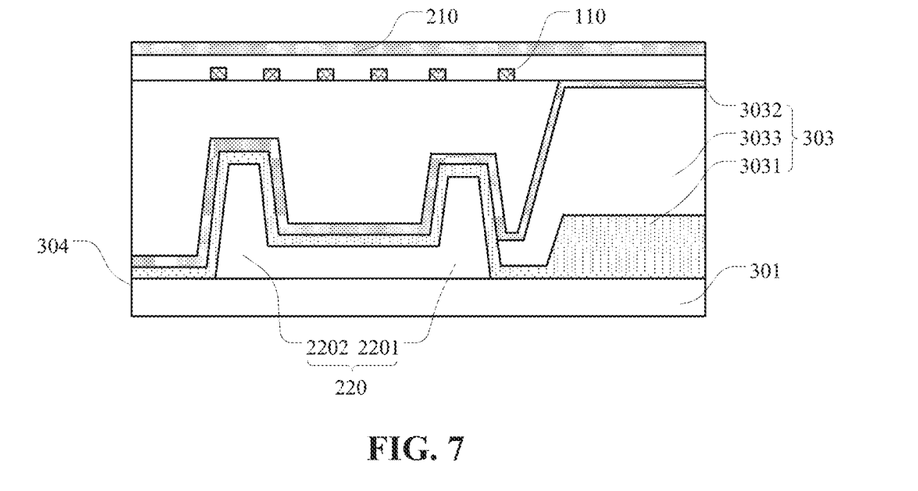
FIG. 7 is a partial schematic diagram illustrating another display panel according to an embodiment of the present disclosure.

In other optional embodiments of the present disclosure, referring to FIG. 7, FIG. 7 is a partial schematic diagram illustrating another display panel according to an embodiment of the present disclosure. The display panel 10 may also be a flexible display panel. The encapsulation cover plate 303 is a thin-film encapsulation layer, and the encapsulation element 220 is a blocking portion located at an edge of the thin-film encapsulation layer. In the embodiment, the thin-film encapsulation layer includes a first inorganic layer 3031, a second inorganic layer 3032, and an organic layer 3033 located between the first inorganic layer and the second inorganic layer. The encapsulation element 220 includes a first blocking portion 2201 and a second blocking portion 2202. The organic layer 3033 stops at the first blocking portion 2201, and the first inorganic layer 3031 and the second inorganic layer 3032 extend and cover the second blocking portion 2202. The electrostatic protective layer 210 covers the encapsulation element 220 so as to prevent damage to the first blocking portion 2201 and the second blocking portion 2202 by static electricity, thereby ensuring that the display panel has a good encapsulation effect.

Figure 8:
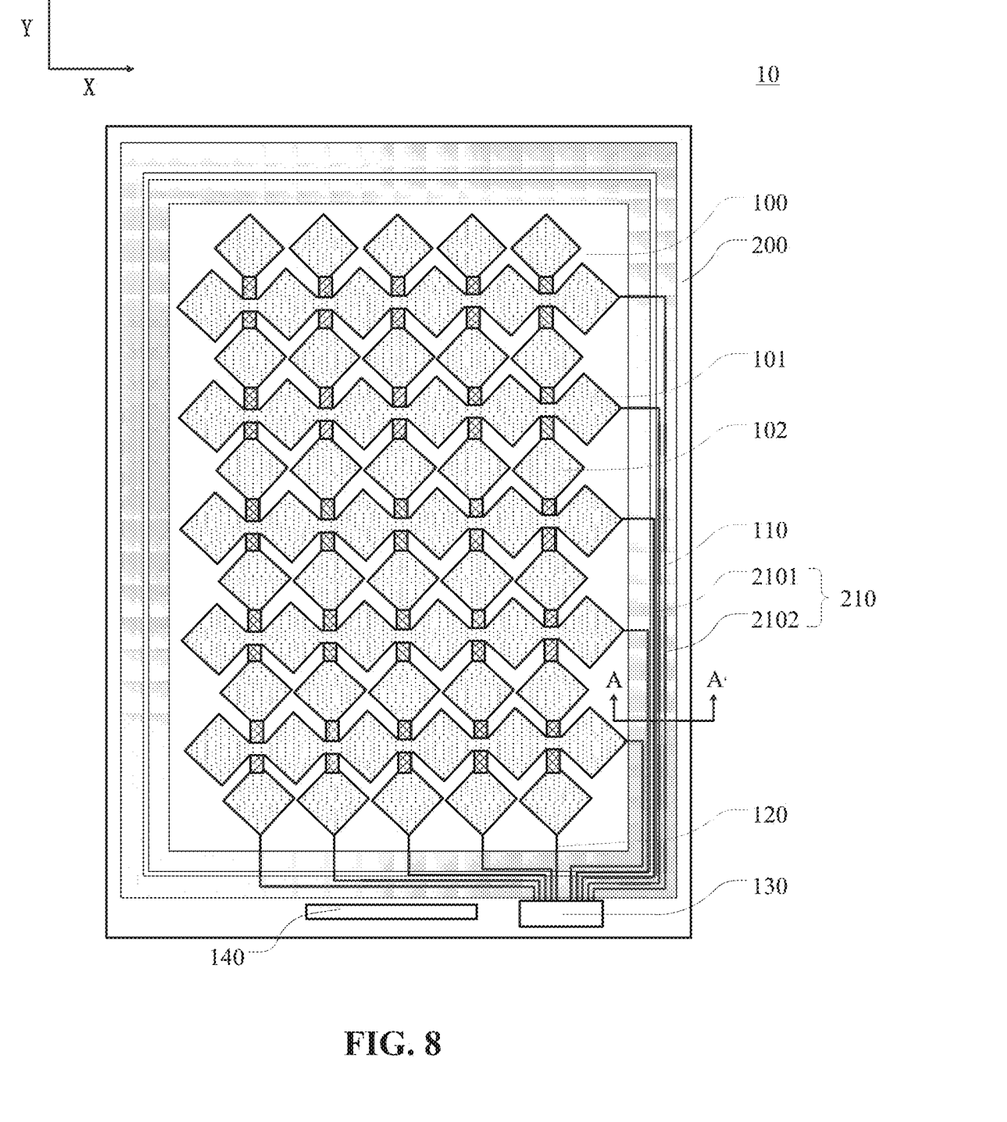
FIG. 8 is a structural diagram illustrating another display panel according to an embodiment of the present disclosure.

Referring to FIG. 8, FIG. 8 is a structural diagram illustrating another display panel according to an embodiment of the present disclosure. The electrostatic protective layer 210 includes a first electrostatic protective layer 2101 and a second electrostatic protective layer 2102. The second electrostatic protective layer 2102 is located on a side of the first electrostatic protective layer 2101 facing away from the display region 100. At least the first electrostatic protective layer 2101 covers the first touch leads 110 in the direction perpendicular to the surface of the display panel. With such a design, the electrostatic protective layer 210 is patterned, and the second electrostatic protective layer 2102 is disposed to be closer to the frame of the display panel. If static electricity is generated, discharge is first performed through the second electrostatic protective layer 2102, and the first electrostatic protective layer 2101 as a further barrier covers the first touch leads 110, so that the first electrostatic touch leads 110 are better protected from electrostatic interference.

In other optional embodiments of the present disclosure, the first electrostatic protective layer 2101 and the second electrostatic protective layer 2102 each may be provided to cover a part of the first touch leads, so that the frame of the display panel can be further reduced while the electrostatic protection capability of the display panel is ensured.

In the embodiment, optionally, as shown in FIG. 7, the display panel further includes an edge cut line 304. The electrostatic protective layer 210 covers the encapsulation element 220 and extends to the edge cut line 304, such that the display panel can be better protected, and can be subjected to electrostatic protection treatment as soon as the static electricity enters the display panel.

Optionally, in the embodiment, the electrostatic protective layer 210 is connected to a ground potential or a fixed potential, the display panel may include a flexible circuit board, and the electrostatic protective layer 210 may be connected to a ground terminal on the flexible circuit board so that static electricity is discharged through the ground terminal. In addition, it should be noted that when the ground potential is applied to the electrostatic protective layer 210, the parasitic capacitance between the electrostatic protective layer 210 and the first touch leads 110 can be made small, thereby ensuring the normal transmission of the touch signal. In addition, a fixed potential may also be applied to the electrostatic protective layer 210, such as an anode signal for providing a signal to the anode of the light-emitting element, or a cathode signal for providing a signal to the cathode of the light-emitting element, or a reset signal for providing a reset signal to the pixel circuit, which is not particularly limited in the embodiment.

Another aspect of the embodiments of the present disclosure provides a display device including the display panel described in any one of embodiments described above.

Figure 9:
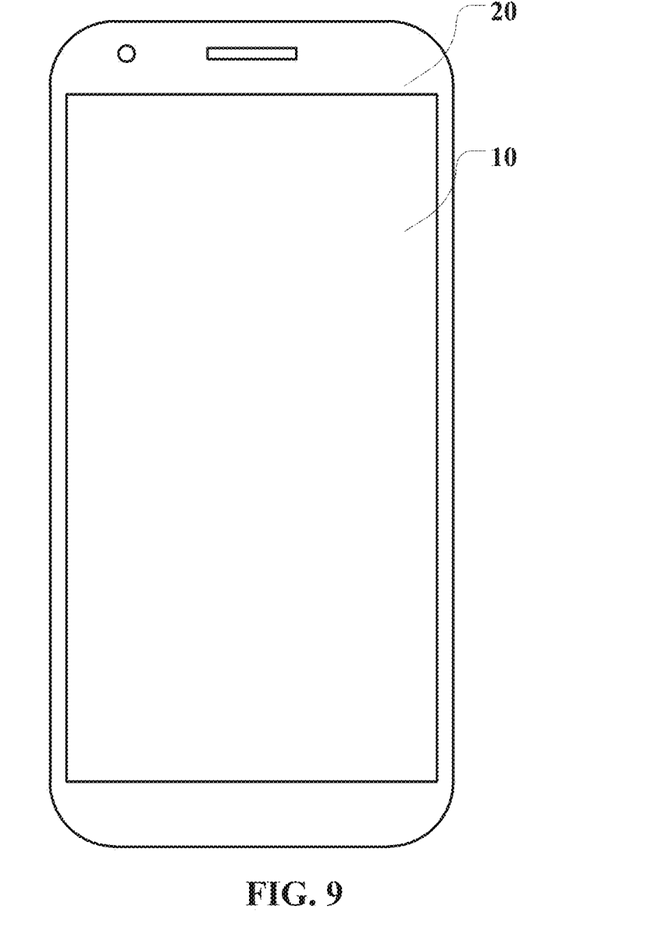
FIG. 9 is a schematic diagram illustrating a display device according to an embodiment of the present disclosure.

Referring to FIG. 9, FIG. 9 is a schematic diagram illustrating a display device according to an embodiment of the present disclosure. A display device 20 includes the display panel 10. The display panel 10 is the display panel described in any one of embodiments described above. The display device 20 may be a mobile phone, a foldable display screen, a laptop, a television, a watch, an intelligent wearing display device, etc., which is not limited in the embodiment.

As can be seen from the above description, for the display panel provided in the embodiment, the display panel 10 includes the first touch electrodes 101, the second touch electrodes 102, the first touch leads 110 and the second touch leads 102. The electrostatic protective layer 210 covers at least the first touch leads 110 and covers the encapsulation element 220 in the direction perpendicular to the surface of the display panel 10, thereby simultaneously protecting the first touch leads 110 and the encapsulation element 220 from electrostatic interference through the electrostatic protective layer 210. The structure is simple, the implementation is easy, and the normal operation of the touch layer and the encapsulation element is ensured, thereby ensuring the normal display function of the display panel. Moreover, in a manner of providing a hollow design, an edge projection design and the like of the electrostatic protective layer 210, the influence of the parasitic capacitance on the touch leads is solved, the electrostatic protection capability is improved, and other functions of the display panel are ensured to be unaffected.

The above content is a further detailed description of the present disclosure in conjunction with the specific preferred embodiments, and the specific implementation of the present disclosure is not limited to the description. For those skilled in the art to which the present disclosure pertains, a number of simple deductions or substitutions may be made without departing from the concept of the present disclosure and should fall within the protection scope of the present disclosure.

What is claimed is:

1. A display panel, comprising:
   a display region and a non-display region around the display region;
   a touch layer comprising first touch electrodes and second touch electrodes, wherein the first touch electrodes are arranged along a second direction and each of the first touch electrodes extends along a first direction, the second touch electrodes are arranged along the first direction and each of the second touch electrodes extends along the second direction, wherein the first direction intersects with the second direction;
   a touch chip, wherein the first touch electrodes are connected to the touch chip through first touch leads, and the second touch electrodes are connected to the touch chip through second touch leads;
   an electrostatic protective layer disposed around the display region; and
   an encapsulation element disposed around the display region; wherein
   in a direction perpendicular to a surface of the display panel, the electrostatic protective layer is configured to cover at least the first touch leads and cover the encapsulation element;
   wherein the display panel is a rigid display panel, and the encapsulation element is a sealing layer disposed around the, display region; or
   wherein the display panel is a flexible display panel including a thin-film encapsulation layer, and the encapsulation element is a blocking portion located at an edge of the thin-film encapsulation layer.

2. The display panel of claim 1, comprising gate signal lines and data signal line, wherein each of the gate signal lines is configured to provide a gate scan signal for a display unit in the display region, and each of the data signal lines is configured to provide a display data signal to the display unit in the display region, each of the gate signal lines extends along the first direction, each of the data signal lines extends along the second direction, and the touch chip is located on a side of the display region along the second direction.

3. The display panel of claim 1, wherein in the, direction perpendicular to the surface of the display panel, the electrostatic protective layer is configured to simultaneously cover the first touch leads and the second touch leads.

4. The display panel of claim 3, wherein each of the second touch electrodes comprises a first sub-touch electrode and a second sub-touch electrode, and along the second direction, the first sub-touch electrode is located on a side of the second sub-touch electrode facing away from the touch chip; and each of the second touch leads comprises a first sub-touch lead and a second sub-touch lead, the first sub-touch electrode is connected to the touch chip through the first sub-touch lead, and the second sub-touch electrode is connected to the touch chip through the second sub-touch lead; wherein the electrostatic protective layer is configured to cover at least the first sub-touch lead.

5. The display panel of claim 1, wherein each of the first touch electrodes comprises a plurality of first touch units connected to each other, each of the second touch electrodes comprises a plurality of second touch units connected to each other, the first touch units and the second touch units are located at a same layer, and each of the second touch units is connected to another one of the second touch units through a bridge; and the bridge is located at a same layer as the first touch leads and the second touch leads.

6. The display panel of claim 5, wherein the electrostatic protective layer is located on the same layer as the first touch units and the second touch units.

7. The display panel of claim 1, wherein a first insulating layer is arranged between the electrostatic protective layer and the first touch leads, and a dielectric constant of the first insulating layer is less than 4.2.

8. The display panel of claim 1, wherein the electrostatic layer is latticed.

9. The display panel of claim 1, wherein a plurality of projections are arranged on a side of the electrostatic protective layer facing away from the display region.

10. The display panel of claim 1, comprising a base substrate and an encapsulation cover plate, wherein the touch layer and the electrostatic protective layer each are located on a side of the encapsulation cover plate facing away from the base substrate.

11. The display panel of claim 1, wherein the electrostatic protective layer comprises a first electrostatic protective layer and a second electrostatic protective layer, the second electrostatic protective layer is located on a side of the first electrostatic protective layer facing away from the display region, and in the direction perpendicular to the surface of the display panel, at least the first electrostatic protective layer is configured to cover the first touch leads.

12. The display panel of claim 11, wherein both of the first electrostatic protective layer and the second electrostatic protective layer are configured to cover part of the first touch leads.

13. The display panel of claim 1, comprising an edge cut line, and the electrostatic protective layer is configured to cover the encapsulation element and extend to the edge cut line.

14. The display panel of claim 1, wherein the electrostatic protective layer is connected to a ground potential or a fixed potential.

15. A display device comprising a display panel, wherein the display panel comprises:

a display region and a non-display region around the display region;

a touch layer comprising first touch electrodes and second touch electrodes, wherein the first touch electrodes are arranged along a second direction and each of the first touch electrodes extends along a first direction, the second touch electrodes are arranged along the first direction and each of the second touch electrodes extends along the second direction, wherein the first direction intersects with the second direction;

a touch chip, wherein the first touch electrodes are connected to the touch chip through first touch leads, and the second touch electrodes are connected to the touch chip through second touch leads;

an electrostatic protective layer disposed around the display region; and an encapsulation element disposed around the display region; wherein in a direction perpendicular to a surface of the display panel, the electrostatic protective layer is configured to cover at least the first touch leads and cover the encapsulation element;

wherein the display panel is a rigid display panel, and the encapsulation element is a sealing layer disposed around the display region; or wherein the display panel is a flexible display panel including a thin-film encapsulation layer, and the encapsulation element is a blocking portion located at an edge of the thin-film encapsulation layer.

16. A display panel, comprising:

a display region and a non-display region around the display region;

a touch layer comprising first touch electrodes and second touch electrodes, wherein the first touch electrodes are arranged along a second direction and each of the first touch electrodes extends along a first direction, the second touch electrodes are arranged along the first direction and each of the second touch electrodes extends along the second direction, wherein the first direction intersects with the second direction;

a touch chip, wherein the first touch electrodes are connected to the touch chip through first touch leads, and the second touch electrodes are connected to the touch chip through second touch leads;

an electrostatic protective layer disposed around the display region; and an encapsulation element disposed around the display region; wherein in a direction perpendicular to a surface of the display panel, the electrostatic protective layer is configured to cover at least the first touch leads and cover the encapsulation element;

wherein the electrostatic protective layer has a hollow structure and comprises at least one opening;

wherein in a direction perpendicular to the surface of the display panel, the opening is configured to cover at least one of the first touch leads.

17. A display device, comprising the display panel of claim 16.

* * * * *